United States Patent
Blosse et al.

(10) Patent No.: US 8,080,453 B1
(45) Date of Patent: Dec. 20, 2011

(54) GATE STACK HAVING NITRIDE LAYER

(75) Inventors: Alain Blosse, Belmont, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/186,453

(22) Filed: Jun. 28, 2002

(51) Int. Cl.
*H01L 21/8238* (2006.01)

(52) U.S. Cl. .............. 438/199; 257/369; 257/E29.157

(58) Field of Classification Search .............. 257/755, 257/377, 384, 369, E29.157; 438/592, 585, 438/653, 199
See application file for complete search history.

(56) References Cited

U.S. PATENT DOCUMENTS

| | | | |
|---|---|---|---|
| 5,385,866 A | 1/1995 | Bartush | |
| 5,393,685 A | 2/1995 | Yoo et al. | |
| 5,633,523 A * | 5/1997 | Kato | 257/369 |
| 5,721,090 A | 2/1998 | Okamoto et al. | |
| 5,756,392 A | 5/1998 | Lu et al. | |
| 5,798,296 A * | 8/1998 | Fazan et al. | 438/592 |
| 5,817,579 A | 10/1998 | Ko et al. | |
| 5,877,074 A | 3/1999 | Jeng et al. | |
| 5,937,289 A | 8/1999 | Bronner et al. | |
| 6,087,063 A | 7/2000 | Hada et al. | |
| 6,107,135 A | 8/2000 | Kleinhenz et al. | |
| 6,117,795 A | 9/2000 | Pasch | |
| 6,121,124 A | 9/2000 | Liu | |
| 6,127,227 A | 10/2000 | Lin et al. | |
| 6,165,884 A | 12/2000 | Lee et al. | |
| 6,177,334 B1 | 1/2001 | Chen et al. | |
| 6,180,453 B1 | 1/2001 | Sung et al. | |
| 6,188,136 B1 * | 2/2001 | Asamura | 257/755 |
| 6,194,128 B1 | 2/2001 | Tao et al. | |
| 6,232,163 B1 | 5/2001 | Voldman et al. | |
| 6,258,677 B1 | 7/2001 | Ang et al. | |
| 6,274,467 B1 | 8/2001 | Gambino et al. | |
| 6,277,200 B2 | 8/2001 | Xia et al. | |
| 6,278,129 B1 | 8/2001 | Sugasawara et al. | |
| 6,284,633 B1 | 9/2001 | Nagabushnam et al. | |
| 6,287,913 B1 | 9/2001 | Agnello et al. | |
| 6,303,482 B1 | 10/2001 | Wu et al. | |
| 6,306,743 B1 * | 10/2001 | Lee | 438/592 |
| 6,342,452 B1 | 1/2002 | Coronel et al. | |
| 6,372,672 B1 * | 4/2002 | Kim et al. | 438/791 |
| 6,380,008 B2 | 4/2002 | Kwok et al. | |
| 6,429,135 B1 | 8/2002 | Chern et al. | |
| 6,429,496 B1 | 8/2002 | Li et al. | |
| 6,448,140 B1 | 9/2002 | Liaw | |
| 6,451,647 B1 | 9/2002 | Yang et al. | |
| 6,465,370 B1 | 10/2002 | Schrems et al. | |
| 6,465,837 B1 | 10/2002 | Wu | |

(Continued)

FOREIGN PATENT DOCUMENTS

EP    0 327 210 A1    8/1989

(Continued)

OTHER PUBLICATIONS

"Silicon Processing for the VLSI Era, vol. 1: Process Technology", Wolf et al.; Lattice Press 1986, pp. 191-194.*

(Continued)

*Primary Examiner* — David Vu

(57) ABSTRACT

A semiconductor structure includes a semiconductor substrate, a gate layer containing silicon on the semiconductor substrate, a metallic layer on the gate layer, and a nitride layer on the metallic layer. The gate layer contains a $P^+$ region and an $N^+$ region.

11 Claims, 6 Drawing Sheets

U.S. PATENT DOCUMENTS

| | | | |
|---|---|---|---|
| 6,479,405 B2 | 11/2002 | Lee et al. |
| 6,506,647 B2 | 1/2003 | Kuroda et al. |
| 6,541,830 B1 | 4/2003 | Iyer |
| 6,552,401 B1 | 4/2003 | Dennison |
| 6,559,007 B1 | 5/2003 | Weimer |
| 6,602,746 B2 * | 8/2003 | Tanaka | 438/201 |
| 6,624,068 B2 | 9/2003 | Thakar et al. |
| 6,635,185 B2 | 10/2003 | Demmin et al. |
| 6,686,242 B2 | 2/2004 | Willer et al. |
| 6,686,617 B2 | 2/2004 | Agnello et al. |
| 6,740,566 B2 | 5/2004 | Lyons et al. |
| 6,797,575 B2 | 9/2004 | Kim et al. |
| 6,812,529 B2 | 11/2004 | Trivedi et al. |
| 6,828,634 B2 | 12/2004 | Oshima |
| 6,897,120 B2 | 5/2005 | Trapp |
| 7,252,773 B2 | 8/2007 | Hall |
| 2002/0058410 A1 | 5/2002 | Sung et al. |
| 2003/0020111 A1 | 1/2003 | Bevan |

FOREIGN PATENT DOCUMENTS

| | | |
|---|---|---|
| WO | WO 00/03425 A1 | 1/2000 |

OTHER PUBLICATIONS

Encyclopedia of Chemical Technology, Kirk-Othmer, vol. 14, pp. 677-709 (1995).

Diaz, C.H., H. Tao, Y. Ku, A. Yen, and K. Young, 2001. "An Experimemtally Validated Analytical Model For Gate Line-Edge Roughness (LER) Effects on Technology Scaling", IEEE Electron Device Letters, 22(6)287-289.

Kamins, T., "Polycrystaline silicon for integrated circuit applications"., Kluwer Academic Publ., Boston, pp. 101-103, (1988).

Wolf, S., "Silicon processing for the VLSI Era, vol. 2: Process Integration"., Lattice Press, Sunset Beach, CA., p. 273, (1990).

Wolf, S., "Silicon processing for the VLSI Era, vol. 4: Deep-Submicron Process Technology"., Lattice Press, Sunset Beach, CA., p. 445, (2002).

U.S. Appl. No. 10/185,645: "Nitride Layer on a Gate Stack," Blosse et al., filed on Jun. 28, 2002; 19 pages.

USPTO Miscellaneous Action for U.S. Appl. No. 10/185,646 dated Jun. 16, 2007; 1 page.

USPTO Notice of Allowance for U.S. Appl. No. 10/185,646 dated Apr. 9, 2007: 5 pages.

USPTO Final Rejection for U.S. Appl. No. 10/185,646 dated Jan. 23, 2007; 7 pages.

USPTO Requirement Restriction/Election for U.S. Appl. No. 10/185,646 dated Dec. 18, 2006; 5 pages.

USPTO Non-Final Rejection for U.S. Appl. No. 10/185,646 dated Jul. 13, 2006: 5 pages.

USPTO Non-Final Rejection for U.S. Appl. No. 10/165,646 dated Mar. 9, 2005; 11 pages.

USPTO Non-Final Rejection for U.S. Appl. No. 10/185,646 dated Aug. 24, 2004: 11 pages.

USPTO Non-Final Rejection for U.S. Appl. No. 10/185,646 dated Sep. 25, 2003: 8 pages.

U.S. Appl. No. 10/314,380: "Multi-Layer Gate Stack" Saurabh Dutta Chowdhury, filed on Dec. 6, 2002; 24 pages.

USPTO Notice of Allowance for U.S. Appl. No. 10/314,380 dated Jan. 25, 2007; 6 pages.

USPTO Non-Final Rejection for U.S. Appl. No. 10/314,380 dated Jul. 27, 2006; 9 pages.

USPTO Non-Final Rejection for U.S. Appl. No. 10/314,380 dated Feb. 22, 2006, 10 pages.

USPTO Non-Final Rejection for U.S. Appl. No. 10/314,380 dated Sep. 1, 2005; 9 pages.

USPTO Final Rejection for U.S. Appl. No. 11/314,380 dated Apr. 29, 2005; 10 pages.

USPTO Non-Final Rejection for U.S. Appl. No. 10/314,380 dated Sep. 27, 2004; 9 pages.

USPTO Miscellaneous Action for U.S. Appl. No. dated Jan. 8, 2004; 1 page.

U.S. Appl. No. 10/313,267: "Controlled Thickness Gate Stack," Blosse et al., filed on Dec. 6, 2002; 26 pages.

USPTO Notice of Allowance for U.S. Appl. No. 10/313,267 dated Aug. 26, 2003: 5 pages.

U.S. Appl. No. 10/313,283: "Method for Cleaning a Gate Stack," Blosse et al., filed on Dec. 5, 2002; 31 pages.

USPTO Final Rejection or U.S. Appl. No. 10/313,283 dated Jul. 31, 2007; 10 pages.

USPTO Non-Final Rejection for U.S. Appl. No. 10/313,283 dated Dec. 5, 2006, 9 pages.

USPTO Advisory Action for U.S. Appl. No. 10/313,283 dated Jan. 6, 2006; 3 pages.

U.S. Appl. No. 10/313,048: "Selective Oxidation of Gate Stack," Blosse et al., filed on Dec. 6, 2002; 25 pages.

U.S. Appl. No. 10/313,049: "Nitride Spacer Formation," Blosse et al., filed on Dec. 6, 2002; 25 pages.

USPTO Notice of Allowance for U.S. Appl. No. 10/313,049 dated May 7, 2004; 4 pages.

USPTO Final Rejection for U.S. Appl. No. 10/313,049 dated Feb. 24, 2004; 9 pages.

USPTO Requirement Restriction/Election for U.S. Appl. No. 10/313,049 dated Oct. 22, 2003; 4 pages.

USPTO Non-Final Rejection for U.S. Appl. No. 10/313,049 dated Apr. 4, 2003; 9 pages.

Kern et al., "Advances in Deposition Processes for Passivation Films," Journal of Vacuum Science & Technology B, Sep./Oct. 1977, vol. 14, No. 5, pp. 1082-1099; 18 pages.

"Material Safety Data Sheet," EKC Technology, Product Name: EKC265, I.E. du Pont de Nemours and Company, Nov. 2004, pp. 1-10; 10 pages.

Kim et al., "Sidewall Oxidation Behavior of Dichlorosilane-Based W-Polycide Gate," Journal of Vacuum Science & Technology B, vol. 19, No. 2, (2001), pp. 361-365; 5 pages.

USPTO Requirement for Restriction/Election for U.S. Appl. No. 10/313,048 dated Mar. 3, 2005; 4 pages.

USPTO Miscellaneous Action for U.S. Appl. No. 10/185,646 dated Jul. 16, 2007; 1 page.

USPTO Notice of Allowance for U.S. Appl. No. 10/185,646 dated Apr. 9, 2007; 5 pages.

USPTO Final Rejection for U.S. Appl. No. 10/185,646 dated Jan. 23, 2007; 7 pages.

USPTO Requirement for Restriction/Election for U.S. Appl. No. 10/185,646 dated Dec. 18, 2006; 5 pages.

USPTO Non-Final Rejection for U.S. Appl. No. 10/185,646 dated Jul. 13, 2006; 5 pages.

USPTO Ex Parte Quayle Action for U.S. Appl. No. 10/185,646 dated Feb. 24, 2006; 4 pages.

USPTO Non-Final Rejection for U.S. Appl. No. 10/185,646 dated Aug. 24, 2005; 6 pages.

USPTO Non-Final Rejection for U.S. Appl. No. 10/185,646 dated Mar. 9, 2005; 11 pages.

USPTO Miscellaneous Action for U.S. Appl. No. 10/185,646 dated Dec. 14, 2004; 2 pages.

USPTO Non-Final Rejection for U.S. Appl. No. 10/185,646 dated Aug. 24, 2004; 11 pages.

USPTO Non-Final Rejection for U.S. Appl. No. 10/185,646 dated Mar. 25, 2004; 10 pages.

USPTO Non-Final Rejection for U.S. Appl. No. 10/185,646 dated Sep. 25, 2003; 8 pages.

USPTO Requirement for Restriction/Election for U.S. Appl. No. 10/185,646 dated Jun. 11, 2003; 4 pages.

USPTO Non-Final Rejection for U.S. Appl. No. 10/313,048 dated Jun. 23, 2005; 8 pages.

USPTO Non-Final Rejection for U.S. Appl. No. 10/313,048 dated Oct. 31, 2005; 8 pages.

USPTO Final Rejection for U.S. Appl. No. 10/313,048 dated Apr. 19, 2006; 10 pages.

USPTO Advisory Action for U.S. Appl. No. 10/313,048 dated Jun. 13, 2006; 3 pages.

USPTO Non-Final Rejection for U.S. Appl. No. 10/313,048 dated Aug. 17, 2006; 8 pages.

USPTO Notice of Allowance for U.S. Appl. No. 10/313,048 dated Oct. 31, 2006; 6 pages.

USPTO Requirement for Restriction/Election for U.S. Appl. No. 10/313,049 dated Oct. 22, 2003; 4 pages.

USPTO Miscellaneous Action for U.S. Appl. No. 10/314,380 dated Jan. 8, 2004; 1 page.
USPTO Non-Final Rejection for U.S. Appl. No. 10/313,283 dated Apr. 12, 2005; 11 pages.
USPTO Notice of Allowance for U.S. Appl. No. 10/313,267 dated Aug. 26, 2003; 5 pages.
USPTO Non-Final Rejection for U.S. Appl. No. 10/313,267 dated Apr. 30, 2003; 5 pages.
USPTO Final Rejection for U.S. Appl. No. 10/313,283 dated Sep. 21, 2005; 8 pages.
USPTO Notice of Allowance for U.S. Appl. No. 10/313,283 dated Mar. 12, 2008; 7 pages.
USPTO Advisory Action for U.S. Appl. No. 10/313,283 dated Nov. 9, 2007; 3 pages.
USPTO Final Rejection for U.S. Appl. No. 10/313,283 dated Jul. 31, 2007; 10 pages.
USPTO Non-Final Rejection for U.S. Appl. No. 10/313,283 dated Apr. 24, 2007; 8 pages.
USPTO Non-Final Rejection for U.S. Appl. No. 10/313,283 dated Dec. 5, 2006; 9 pages.
USPTO Advisory Action for U.S. Appl. No. 10/313,283 dated Oct. 27, 2006; 3 pages.
USPTO Final Rejection for U.S. Appl. No. 10/313,283 dated Jul. 27, 2006; 9 pages.
USPTO Non-Final Rejection for U.S. Appl. No. 10/313,283 dated Feb. 15, 2006; 9 pages.
Kim, H-S., et al., "Sidewall oxidation behavior of dichlorosilane-based W-polycide gate"., J. Vac. Science Technology, vol. 19, No. 2, pp. 361-365, (2001); 5 pages.
Blosse, A.P., "Improved thermal stability of CVD WSix during furnace oxidation by a rapid thermal anneal pretreatment"., published as "Rapid Thermal and Integrated Processing VII"., Semiconductors Electronic Material and Processing, vol. 525, 7 pages, (1998).

* cited by examiner

GATE STACK HAVING NITRIDE LAYER

BACKGROUND

Modern integrated circuits are constructed with up to several million active devices, such as transistors and capacitors, formed in and on a semiconductor substrate. Interconnections between the active devices are created by providing a plurality of conductive interconnection layers, such as polycrystalline silicon and metal, which are etched to form conductors for carrying signals. The conductive layers and interlayer dielectrics are deposited on the silicon substrate wafer in succession, with each layer being, for example, on the order of 1 micron in thickness.

A gate structure is an element of a transistor. FIG. 1 illustrates an example of a gate stack 8. A semiconductor substrate 10 supports a gate insulating layer 16, which overlaps doped regions (source/drain regions) in the substrate (12 and 14), and the gate insulating layer supports a gate 18, which is typically polycrystalline silicon. On the gate is a metallic layer 30. The metallic layer may be separated from the gate by one or more other layers, such as nitrides, oxides, or silicides, illustrated collectively as barrier layer 20. The metallic layer may in turn support one or more other layers (collectively 40), such as nitrides, oxides, or silicides. Oxide 22 may be formed on the sides of the gate to protect the gate oxide at the foot of the gate stack; and insulating spacers 24 may be formed on either side of the gate stack. Furthermore, contacts to the source/drain regions in the substrate, and to the gate structure, may be formed.

Self-aligned contacts (SAC) allow the design of a semiconductor device to have a distance between the gate and the via contact to the substrate, to be at most one-half the minimum gate width; the contact may even be designed to overlay the gate. Typically, SAC uses a nitride layer on the gate stack, together with spacers that include nitride, to prevent a misaligned contact from electrically contacting the gate itself. If the nitride were not present, then the etch used to form the hole which will become the contact would pass through the dielectric layer all the way to the gate. When present, the nitride layer and spacers act as an etch stop, preventing misalignment from forming a hole all the way to the gate, and therefore allowing design of the device to have a much smaller average distance between the contact and the gate.

The nitride layer on the gate stack has at least a thickness of 800 angstroms when used for forming SAC. If used only for other purposes, such as an etch-stop layer or a hard mask, a thickness of less than 800 angstroms is used. Also, the thickness of at least 800 angstroms is the thickness after the dielectric layer has been formed; the nitride layer is usually thicker when originally formed, allowing for a loss of about 500 angstroms during the gate etch (i.e. thickness for the hard mask function), and a loss of about 200 angstroms during nitride spacer formation.

There is an ongoing need to reduce the size of the elements within integrated circuits and semiconductor structures. As the size of an element is reduced, it becomes more likely that irreversible changes will occur in the compositions of the various layers and regions within an element. These changes are typically related to diffusion, which is dependent on the elevated temperatures used for processing and the length of time the temperatures are maintained. It is thus desirable to perform processing at cooler temperatures and/or to reduce the time necessary to carry out the processing.

BRIEF SUMMARY

In a first aspect, the present invention is a method of making a semiconductor structure, comprising depositing a nitride layer on a metallic layer. The metallic layer is on a gate comprising silicon, the gate is on a semiconductor substrate, and the gate comprises a $P^+$ region and an $N^+$ region.

In a second aspect, the present invention is a semiconductor structure comprising a semiconductor substrate, a gate comprising silicon on the semiconductor substrate, a metallic layer on the gate, and a nitride layer on the metallic layer. The gate comprises a $P^+$ region and an $N^+$ region.

In a third aspect, the present invention is a semiconductor structure comprising a semiconductor substrate, a gate comprising silicon on the semiconductor substrate, a barrier layer on the gate, a metallic layer on the barrier layer, and a nitride layer on the metallic layer. The gate comprises a $P^+$ region and an $N^+$ region, the barrier layer comprises tungsten, and the metallic layer comprises tungsten.

The term "distance" means the length between the closest edges of the two objects.

DETAILED DESCRIPTION

The present invention includes forming a nitride layer on a gate stack at lower temperatures than are typically used, by plasma enhanced chemical vapor deposition (PECVD). The present invention is particularly suited to forming a gate stack including a gate having both $P^+$ and $N^+$ doping regions, where the lower temperature of the PECVD inhibits excessive diffusion of dopants.

Figure 1:
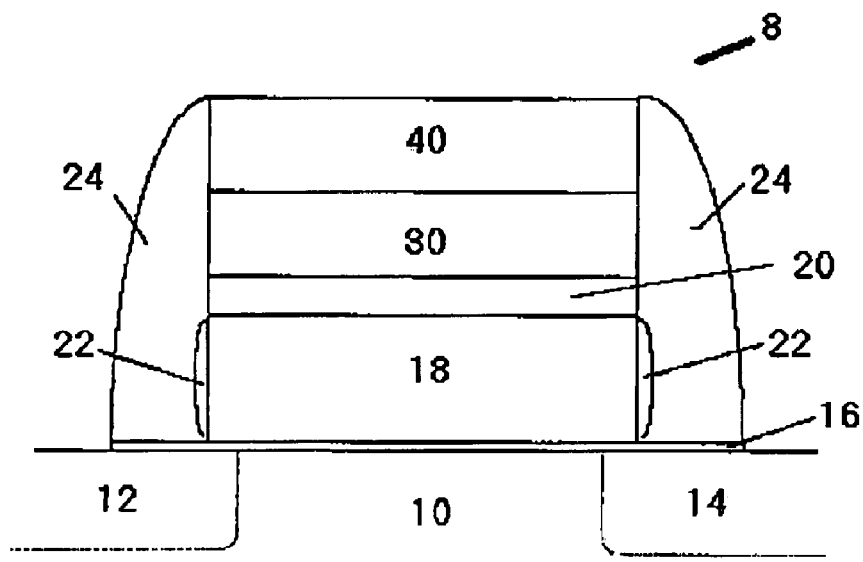
FIG. 1 shows a gate stack structure.
Figure 2:
FIGS. 2-7 illustrate a method of forming the structure of FIG. 8.

Referring to FIG. 2, a gate insulating layer 102 is on a semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer 102 may be a conventionally known insulating material. For example, the gate insulating layer may contain silicon oxide or silicon oxynitride.

Figure 3:
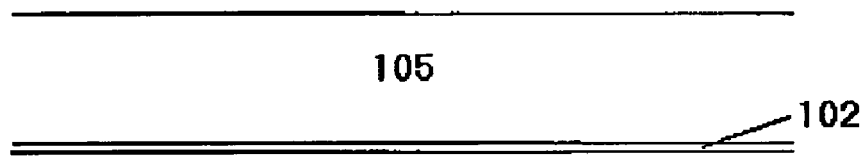

Referring to FIG. 3, a gate layer 105 may be formed on the gate insulating layer. The gate layer may contain a variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS; those regions of the gate that are $N^+$ doped (such as with $As^+$ or phosphorus$^+$) are over $P^-$ doped channel regions of the substrate, forming an NMOS. The $P^+$ and $N^+$ doping regions of the gate are separated by a region which is on an isolation region of the substrate; this isolation region has a width of at most 0.4 microns, more preferably at most 0.36 microns. The doping of the regions of the gate is preferably carried out after forming the gate, by masking and doping each region separately, or by an overall doping of the gate with one dopant type, and then masking and doping only one region with the other dopant type (counter doping).

Figure 4:
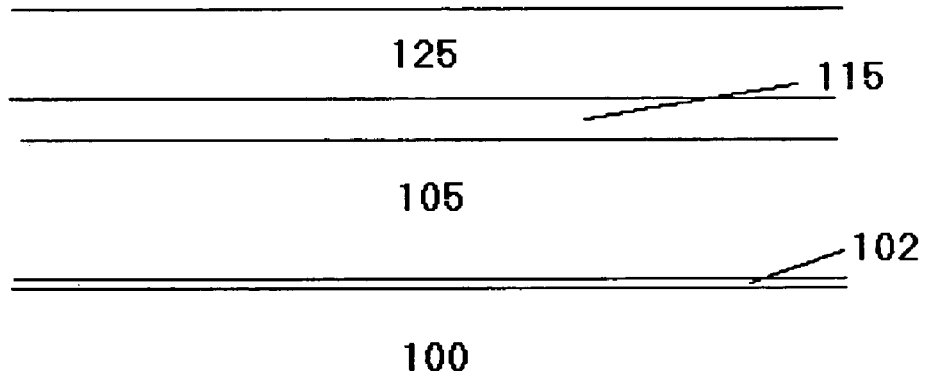

Referring to FIG. 4, a barrier layer 115 may optionally be formed on the gate layer. The optional barrier layer may contain a variety of materials, including nitrides, silicides, and oxides, and is preferably a conductive material. For example, the barrier layer may contain refractory silicides and nitrides. Preferably, the barrier layer contains silicon nitride, or a nitride or silicide of a metal such as tantalum, titanium, niobium or tungsten, for example tungsten nitride.

Referring still to FIG. 4, a metallic layer 125 may be formed on the gate layer, or the barrier layer 115, if it is present. The metallic layer 125 may contain a variety of metal-containing materials. For example, a metallic layer may contain aluminum, copper, tantalum, titanium, tungsten, or alloys or compounds thereof. The metallic layer may be formed, for example, by physical vapor deposition (PVD) of the metal, or by low pressure chemical vapor deposition (LPCVD) of a mixture of a metal halide and hydrogen.

Figure 5:
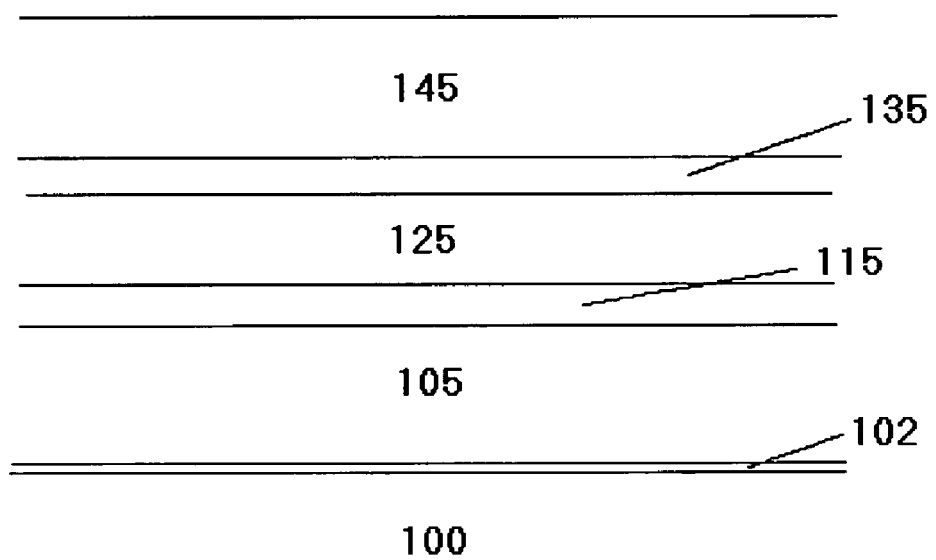

Referring to FIG. 5, a barrier layer 135 may optionally be formed on the metallic layer. The formation of the second optional barrier layer may be performed as described for the first optional barrier layer 115.

Referring still to FIG. 5, nitride layer 145 may be formed on the metallic layer by a variety of methods, including chemical vapor deposition (CVD). Preferably, the nitride layer is silicon nitride formed by PECVD. The nitride layer may vary in composition, so that the top of the nitride layer is anti-reflective, for example so that the top of the nitride layer is silicon rich silicon nitride, or silicon oxynitride; this layer may also act as a hard mask to protect the nitride layer during subsequent etches. Alternatively, a separate anti-reflective layer (ARC) may be formed.

Preferably, the nitride layer is formed rapidly at a relatively low temperature. For example, if the gate layer contains both $P^+$ and $N^+$ doping regions, diffusion of the dopants may occur if the wafer is maintained at sufficiently high temperatures for a prolonged period of time. Thus, it is desirable that any high temperature processing is performed only for relatively short periods of time. Likewise, it is desirable that any lengthy processing is carried out at relatively low temperatures. Preferably, the nitride layer is formed at a temperature of at most 750° C., if the atmosphere is substantially devoid of oxygen, or in a reducing environment. Under typical conditions, a temperature of at most 600° C. is preferred, at most 450° C. is more preferred. A temperature of at least 350° C. is preferred. The depositing of the nitride layer is preferably carried out at a temperature and for a time that does not result in substantial diffusion between the $P^+$ region and the $N^+$ region in a split gate.

"Substantial diffusion between the $P^+$ region and the $N^+$ region" of the gate means that the threshold voltage ($V_T$) one or both of the PMOS or NMOS changes by more than 20 mV, more preferably 10 mV, even more preferably 5 mV. In order to determine if a nitride deposition results in substantial diffusion between the $P^+$ region and the $N^+$ region of a particular split gate, a single PMOS or NMOS is formed, with the other part of the gate forming a comparatively very large reservoir of the opposite doping type, separated by an isolation region of the same size as the actual device. The PMOS or NMOS is formed using the nitride deposition, and using BTBAS (tetra (bis-t-butylamino)silane, also known more simply as bis-t-butyl amino silane) and ammonia at about 550° C. for spacer deposition, and low temperature selective oxidation, as used in the example.

Figure 6:
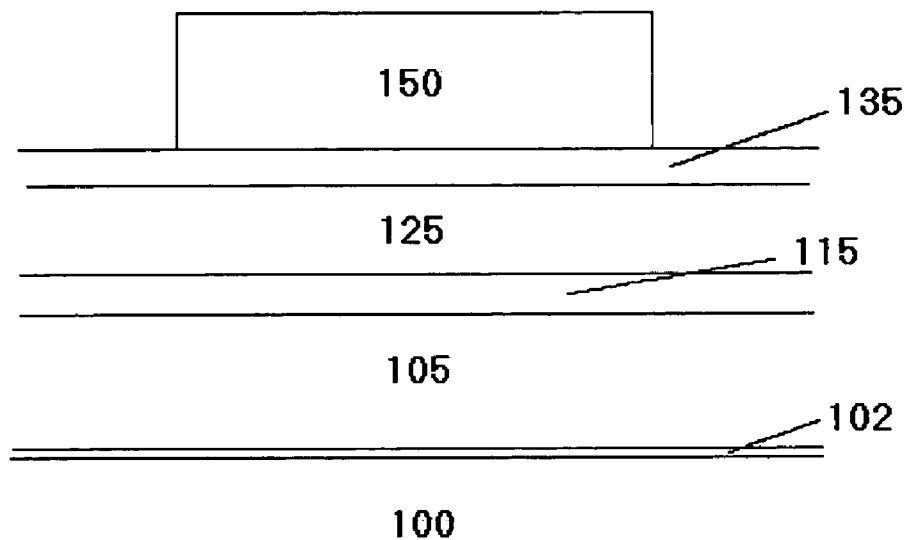
Figure 7:
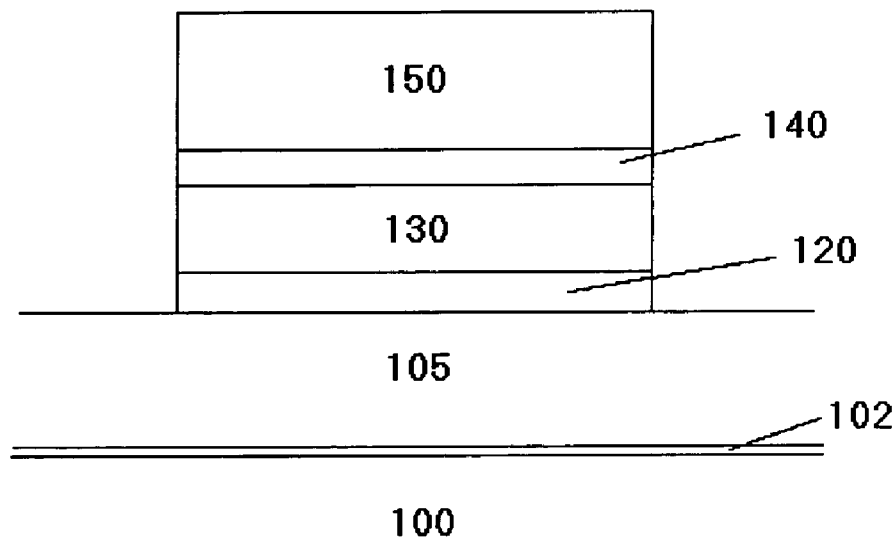
Figure 8:
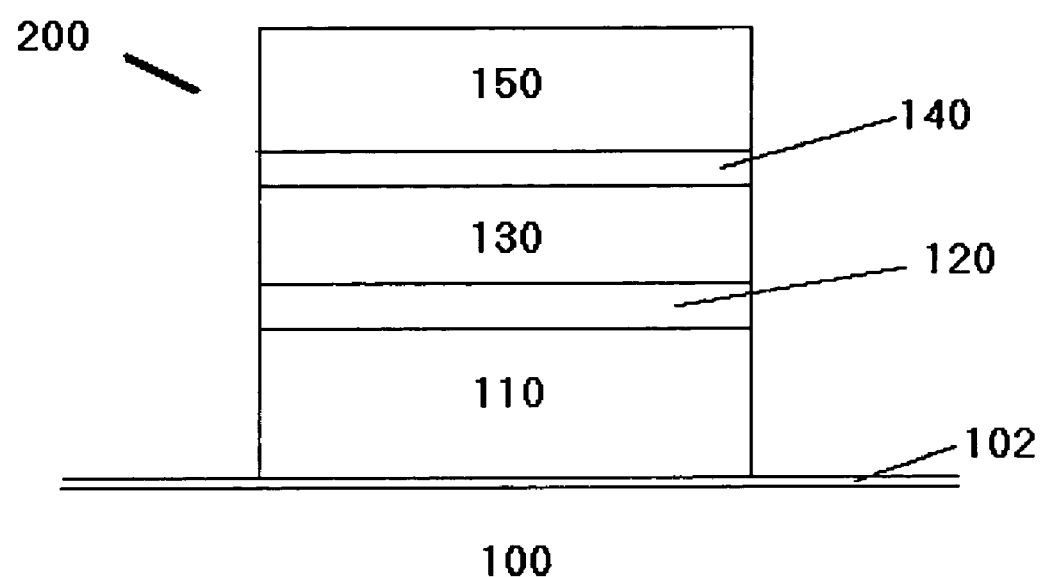
FIG. 8 shows a gate stack of the present invention.

Referring to FIGS. 6-8, each layer may be patterned to form the gate stack. The patterning may be accomplished, for example, by conventional photolithographic and etching techniques. Referring to FIG. 6, the nitride layer may be etched to form a patterned nitride layer 150, for example by forming a patterned photoresist on nitride layer 145 (FIG. 5) and then etching the exposed portions of the layer. The nitride etching may be carried out by conventional nitride etch techniques, for example by exposure to a plasma formed from a mixture of $CF_4$ and $CHF_3$.

Referring to FIG. 7, the patterned nitride layer may be used as a hard mask for the etching of the metallic layer 125 (FIG. 6) to form a patterned metallic layer 130. Referring to FIG. 8, the patterned nitride layer and the patterned metallic layer may be used as a hard mask for the etching of the gate layer 105 (FIG. 7) to form patterned gate layer 110. The gate etching may be carried out by conventional gate etch techniques, for example by exposure to a plasma formed from chlorine, hydrobromic acid and/or oxygen.

FIG. 8 thus illustrates a gate stack 200 which may be formed on a semiconductor wafer. Semiconductor substrate 100 supports a gate insulating layer 102, which in turn supports a gate layer 110. The gate layer supports a metallic layer 130, which may optionally be separated from the gate layer by barrier layer 120. The metallic layer may optionally support a barrier layer 140. The nitride layer 150 is on the metallic layer 130, or optionally on the layer 140 above the metallic layer.

Figure 9:
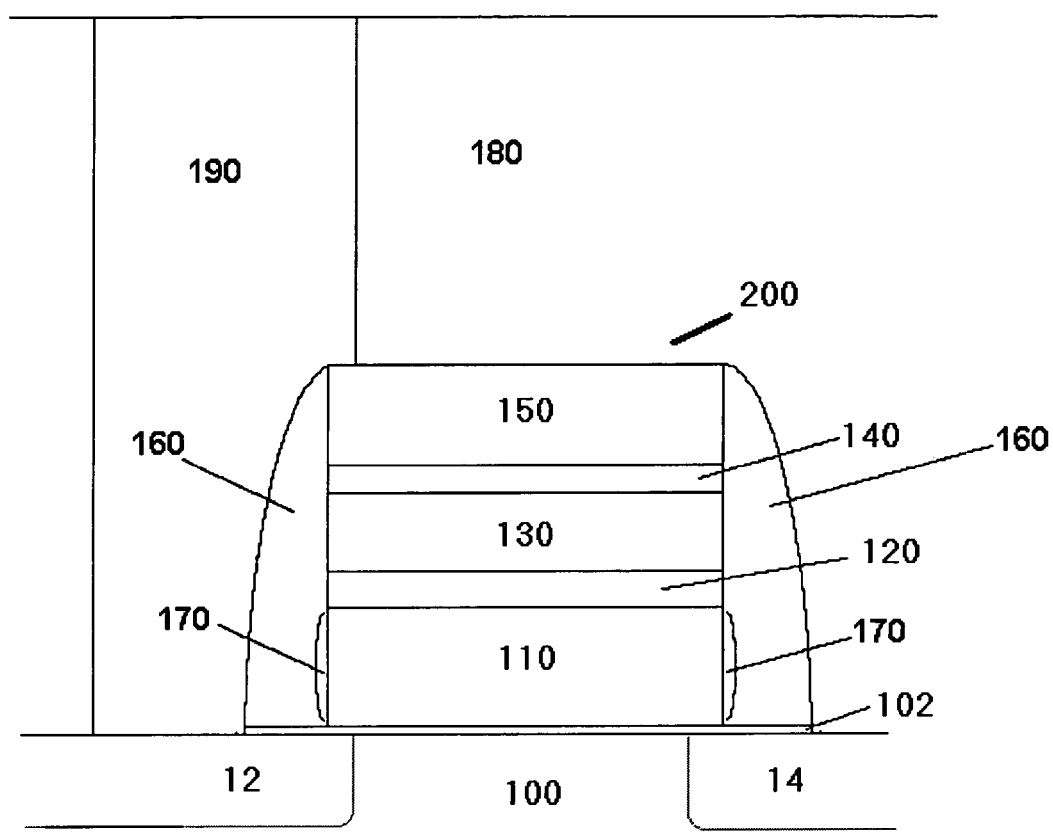
FIG. 9 shows the gate stack of FIG. 8 after further processing.
Figure 10:
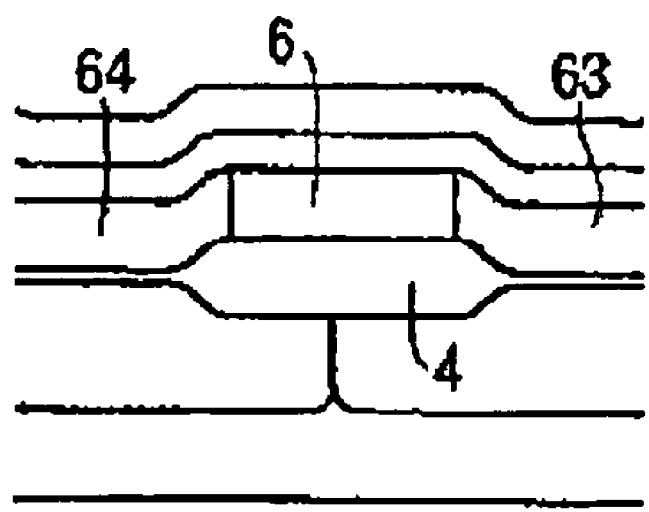
FIG. 10 shows a gate layer having a $P^+$ region (64) and an $N^+$ region (63) separated by a region (6) which is on an isolation region (4) of the substrate, having a width of at most 0.4 microns.

Further processing of the gate structure may include forming sidewall oxide regions 160 on gate layer 110 and forming spacers 170 (preferably containing nitride) on the sides of the stack. Furthermore, a dielectric layer 180 maybe formed on the nitride layer, and contacts 190 formed through the dielectric to the substrate, as illustrated in FIG. 9, as well as contacts to the gate itself. After dielectric layer is formed, the nitride layer has a thickness of at least 800 angstroms, preferably at least 1100 angstroms, so that it may be used to allow formation of SAC. Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

EXAMPLE

Example 1

Formation of a Gate Structure

The following detailed steps were used to form the gate stack having a split gate:

---

Nitrogen-containing gate oxide formation
Poly deposition—single amorphous gate deposit
Mask for P-doping
$P^+$ poly implantation
N-well implantation
P-channel implantation
$P^+$ poly implantation strip resist
Mask for N-doping
P-well implantation
$N^+$ poly implantation
N-channel implantation
$N^+$ poly implantation strip resist
Tungsten PVD, sputtering (nitrogen + argon, then argon only)
Nitride—PECVD
Deposit ARC and Resist
Etch mask for nitride
Nitride etch—ARC and silicon nitride
Remove resist
Tungsten and Poly etch
Selective oxidation
N doping of source/drain shallow extension region mask
As implant
Boron halo implant
Stripping & cleaning
P doping of source/drain shallow extension region mask
P-type (boron) implant
As halo implant
Stripping & cleaning
Nitride spacer deposition (BTBAS chemistry)
Spacer etch
source/drain implant
Dielectric deposition/planarization/mask for contacts
self-aligned contact (SAC) etch
SAC etch clean using $N_2/H_2$ or $NF_3H_2/Ar$, and then solvent

---

The silicon nitride layer had a thickness of 1300 angstroms (although the actual amount deposited was greater since silicon nitride is lost during the poly etch), the tungsten layer had a thickness of 400 angstroms, the tungsten nitride layer had a thickness of 75 angstroms, and the poly layer had a thickness of 800 angstroms. The contacts having a width of 0.13 microns at the top, and a width of 0.05 microns at the bottom.

The resist material was removed by ashing, and the stack was cleaned by treating the wafer with EKC265™ (EKC, Hayward, Calif.; a mixture of 2-(2 aminoethoxy) ethanol, hydroxylamine and catechol) by spinning with spraying (using a spray tool) at 65-85° C. for 10 minutes, then 2 minutes at 20° C. followed by rinsing with deionized water, to prevent undesirable oxidation of the tungsten.

The exposed sides of the poly were covered with a layer of oxide about 50-70 angstroms thick by the selective oxidation. This was carried out by exposing the stack to a mixture of hydrogen and oxygen (5-15% steam) at a temperature of 750° C. to selectively oxidize the poly relative to the tungsten and tungsten nitride.

Etching of the nitride (nitride on poly contact mask etch) was carried out with a plasma at a pressure of 35 mT, at a power of 280 W, a temperature of 15° C. The gas composition for the main etch was $CHF_3$ at 30 sccm, Ar at 60 sccm, and $O_2$ at 10 sccm. The clean was carried out with plasma ashing in two steps, followed by a solvent clean:

Step 1:
pressure of 2 T, temp. of 185° C., microwave power of 800 W, gas: $O_2$ at 3750 sccm, $N_2$ at 375 sccm;
Step 2:
same values, except temp. of 200° C. and microwave power of 1400 W.
Solvent Clean:
EKC 265™, with a spray tool: temp. of 70° C. for 10 minutes, and an extra 2 minutes at 20° C., followed by rinsing with deionized water and then spin drying in $N_2$. Alternatively this may be done with $H_2SO_4$ at 150° C. twice for 10 minutes each and then spin drying in $N_2$.

Etching to form contacts (SAC etch) was carried out with a plasma at a pressure of 55 mT, a power of 500 W, a temperature of 35° C., with the magnet at 20 Gauss, a gas of $CF_4$ at 5 sccm, $CHF_3$ at 10 sccm, $C_2H_2F_4$ at 10 sccm, and Ar at 90 sccm, as the ARC etch; and as the main etch a pressure of 55 mT, a power of 500 W, a temperature of 35° C., with the magnet at 25 Gauss, a gas of $CHF_3$ at 80 sccm, $C_2H_2F_4$ at 8 sccm, and Ar at 90 sccm. The clean was carried out with plasma ashing in two steps, followed by a solvent clean:

Step 1:
pressure of 400 mT, temp. of 20+/−5° C., RF power of 420 W, gas: $O_2$ at 400 sccm.
Step 2:
pressure of 750 mT, temp. of 20+/−5° C., RF power of 420 W, gas: $N_2$ at 400 sccm, $H_2$ at 400 sccm, and $NF_3$ at 5 sccm; or alternatively:
pressure of 750 mT, temp. of 40+/−5° C., RF power of 350 W, gas: $CF_4$ at 20 sccm, $N_2/5\% H_2$ at 200 sccm, and $O_2$ at 500 sccm.
Solvent Clean:
EKC 265™, with a spray tool: temp. of 70° C. for 10 minutes, and an extra 2 minutes at 20° C., followed by rinsing with deionized water and then spin drying in $N_2$. Alternatively this may be done with $H_2SO_4$ at 150° C. twice for 10 minutes each and then spin drying in $N_2$.

The invention claimed is:

1. A method of making a semiconductor structure, comprising:
    depositing a first barrier layer on a continuous metallic layer, the continuous metallic layer disposed on a second barrier layer, the second barrier layer disposed on a gate layer comprising silicon, and the gate layer disposed on a semiconductor substrate, wherein the gate layer comprises a $P^+$ region and an $N^+$ region, and wherein the $P^+$ and $N^+$ regions are separated by a region which is on an isolation region of the substrate having a width of at most 0.4 microns; and
    depositing a nitride layer on the first barrier layer, the depositing comprising a PECVD process carried out at a temperature of approximately 350° C.

2. The method of claim 1, wherein the continuous metallic layer comprises tungsten.

3. A method of making a semiconductor device, comprising:
    forming a semiconductor structure by the method of claim 1, and
    forming a semiconductor device from the semiconductor structure.

4. A method of making an electronic device, comprising:
    forming a semiconductor device by the method of claim 3, and
    forming an electronic device comprising the semiconductor device.

5. The method of claim 1, further comprising forming a dielectric layer on the nitride layer.

6. The method of claim 5, further comprising forming a contact through the dielectric layer to the substrate.

7. The method of claim 6, wherein a distance between the gate layer and the contact to the substrate is at most one-half a minimum gate width.

8. The method of claim 1, wherein the second barrier layer comprises titanium silicide.

9. The method of claim 1, wherein the first barrier layer comprises titanium.

10. The method of claim 1, wherein the second barrier layer comprises titanium.

11. The method of claim 1, wherein the nitride layer has a thickness of at least 1100 angstroms.

* * * * *